United States Patent
Gray et al.

(10) Patent No.: US 8,347,027 B2
(45) Date of Patent: Jan. 1, 2013

(54) REDUCING POWER CONSUMPTION FOR DYNAMIC MEMORIES USING DISTRIBUTED REFRESH CONTROL

(75) Inventors: Scott Gray, Peoria, AZ (US); Kevin Stover, Glendale, AZ (US)

(73) Assignee: Honeywell International Inc., Morristown, NJ (US)

( * ) Notice: Subject to any disclaimer, the term of this patent is extended or adjusted under 35 U.S.C. 154(b) by 329 days.

(21) Appl. No.: 12/612,722

(22) Filed: Nov. 5, 2009

(65) Prior Publication Data

US 2011/0107022 A1    May 5, 2011

(51) Int. Cl.
    *G06F 12/00* (2006.01)
(52) U.S. Cl. .................... 711/106; 711/105
(58) Field of Classification Search .............. None
    See application file for complete search history.

(56) References Cited

U.S. PATENT DOCUMENTS

| | | | |
|---|---|---|---|
| 6,167,484 A | 12/2000 | Boyer et al. | |
| 6,195,303 B1 * | 2/2001 | Zheng | 365/222 |
| 6,587,918 B1 * | 7/2003 | Christenson | 711/106 |
| 6,871,261 B1 | 3/2005 | Proebsting | |
| 6,898,663 B2 | 5/2005 | Winograd et al. | |
| 6,967,885 B2 | 11/2005 | Barth, Jr. et al. | |
| 7,020,741 B1 | 3/2006 | Tischler | |
| 7,565,480 B2 | 7/2009 | Ware et al. | |
| 2002/0056022 A1 * | 5/2002 | Leung | 711/106 |
| 2005/0226079 A1 * | 10/2005 | Zhu et al. | 365/230.03 |
| 2005/0235102 A1 * | 10/2005 | Sakurai | 711/106 |
| 2006/0112217 A1 * | 5/2006 | Walker | 711/106 |
| 2006/0294296 A1 * | 12/2006 | Teng | 711/106 |
| 2007/0198771 A1 * | 8/2007 | Seo | 711/106 |
| 2008/0270683 A1 | 10/2008 | Barth et al. | |
| 2009/0070612 A1 * | 3/2009 | Adelman et al. | 713/322 |
| 2009/0141575 A1 | 6/2009 | Kohler et al. | |
| 2009/0193186 A1 | 7/2009 | Barth, Jr. et al. | |
| 2009/0193187 A1 | 7/2009 | Barth, Jr. et al. | |

* cited by examiner

Primary Examiner — Than Nguyen
(74) *Attorney, Agent, or Firm* — Fogg & Powers LLC (57) ABSTRACT

A method for refreshing memory is provided. The method comprises determining when a first memory of a plurality of memories is not being accessed and sending a refresh opportunity command from a master refresh controller to one of a plurality of local refresh controllers when the first memory is not being accessed, wherein the one of a plurality of local refresh controllers controls only the first memory. The method further comprises determining when the first memory needs refreshing and refreshing the first memory.

19 Claims, 6 Drawing Sheets

REDUCING POWER CONSUMPTION FOR DYNAMIC MEMORIES USING DISTRIBUTED REFRESH CONTROL

BACKGROUND

System-on-chip (SOC) devices typically have electronic components and large dynamic memories integrated on a single integrated circuit. Dynamic memories require periodic refreshing to retain stored information. Memory in a SOC is usually refreshed by bringing the entire memory array out of a low power state each time one of the memory macros that make up the memory array requires refreshing. In other words, the entire array is turned on periodically to be refreshed using a global refresh controller. Another refreshing method keeps track of the memory's refresh states and adjusts refresh activity accordingly. These methods reduce the SOC's processing speed and increase its power consumption and peak operating power.

SUMMARY

One embodiment describes a method for refreshing memory. The method comprises determining when a first memory of a plurality of memories is not being accessed and sending a refresh opportunity command from a master refresh controller to one of a plurality of local refresh controllers when the first memory is not being accessed, wherein the one of a plurality of local refresh controllers controls only the first memory. The method further comprises determining when the first memory needs refreshing and refreshing the first memory.

DRAWINGS

Like reference numbers and designations in the various drawings indicate like elements.

DETAILED DESCRIPTION

A system on chip (SOC) comprises a plurality of memories that require periodic refreshing. A refresh operation can be distributed to each memory such that any memory not currently in use may be refreshed in a timely manner. Distributing the refresh operation eliminates refresh timing impacts to a processor accessing the memory in substantially all circumstances. Distributed refresh improves power management for refresh through providing clocking only to those memories that are in use through data access by the system or are currently undergoing refresh. Through power management, no memory is on unless it is accessed or refreshed. Refreshing memories in this manner maintains the memory state with significantly less performance impact but without requiring elaborate refresh state tracking.

Figure 1:
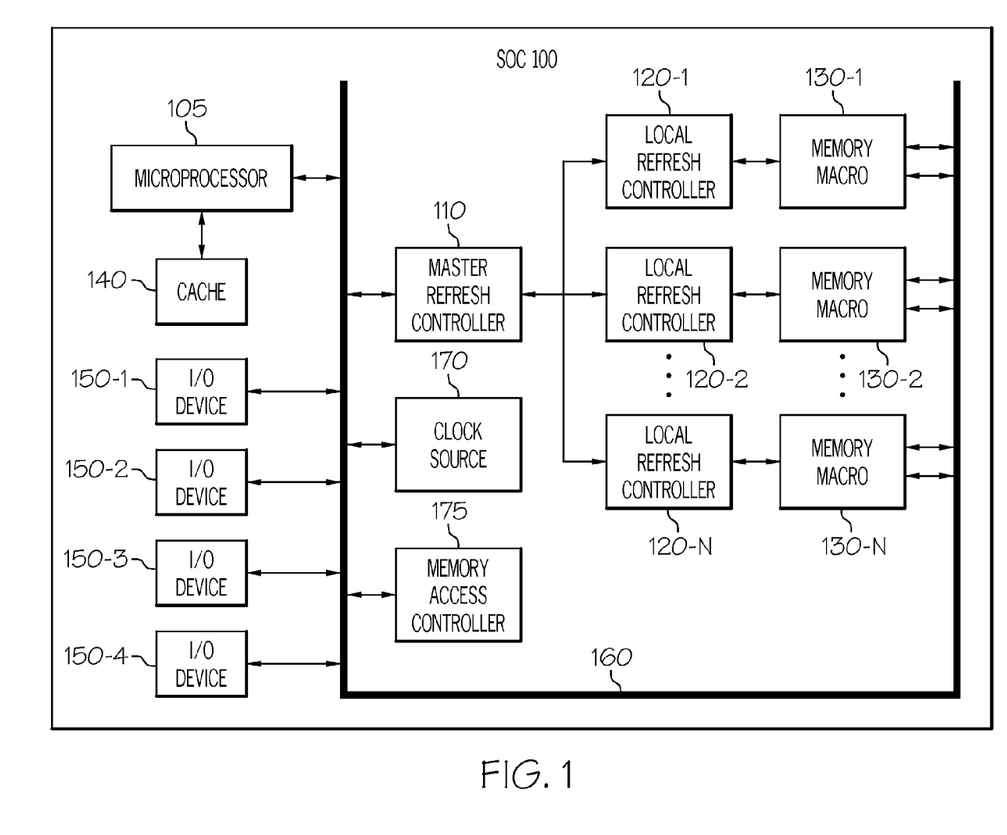
FIG. 1 is one embodiment of a system on a chip (SOC) with distributed refresh control.

FIG. 1 is one embodiment of a system on a chip (SOC) 100 with distributed refresh control. The SOC 100 comprises at least one microprocessor 105 with a cache 140. The microprocessor 105 is communicatively coupled to a plurality of memories 130-1 through 130-N (hereinafter referred to as memories 130) via a frontside bus 160. Input/Output (I/O) devices 150-1 through 150-4 (hereinafter referred to as I/O devices 150) are also coupled to the frontside bus 160. A memory access controller 175 controls the microprocessor's 105 access to the memories 130.

The memories 130 have M number of ports. In the embodiment of the SOC in FIG. 1, the memories 130 are depicted as dual ported. The memories 130 require a predetermined number of refreshes within a certain time period. In other words, the memories 130 require K refreshes in a time period T. K may vary between different memories 130. T/K defines an average refresh timeout period in which the memory must be refreshed at least once.

The only time the clock to a memory will be on is when a processor or other resource is accessing the memory or the memory is being refreshed. For example, when there are N memories 130 with M ports that can be in use at any given time, assuming that the SOC 100 treats the entire memory array as a whole, then the maximum number of ports to the array that can be in use at once is M. Therefore, there is a minimum of N minus M memories that are idle on any given clock cycle (not counting any memories undergoing refresh). Those memories 130 that are idle can be refreshed without affecting performance of the SOC 100.

Each memory 130 is communicatively coupled to a local refresh controller 120-1 through 120-N (hereinafter referred to as local refresh controllers 120). For example, memory 130-1 is coupled to local refresh controller 120-1, memory 130-2 to local refresh controller 120-2, and so on, such that each local refresh controller 120 is responsible for refreshing only a single memory 130 to which it is connected. Each local refresh controller 120 is independent of each other. The local refresh controllers 120 ensures that K refreshes per time T are performed on the memory 130 it controls. Each local refresh controller 120 is controlled by a master refresh controller 110.

A clock source 170 provides a clocking signal to the SOC 100. In one embodiment, a clock tree internal to the SOC 100 is provided from the clocking source 170. The clock source 170 can comprise an internal phase locked loop (PLL) or any other clocking source known to those in the art. The clock source 170 is a central clock that is sent to the local refresh controllers 130 and the master refresh controller 110. In one embodiment, each memory 130, local refresh controller 120, and master refresh controller 110 has a clock.

The memories 130 are clocked by the clock source 170. The memories 130 are in a low power state unless they receive the clock signal from the clock source 170. In other words, the clock at each memory 130 is off when the memory 130 is in a low power state, and on when the memory 130 is in a high power state. The local refresh controllers 120 individually gate the clock (that is, the signal from clock source 170) for their memory. The memory's 130 clock is gated by the local refresh controller 120 and as well as by the memory access controller 175. This clocking configuration reduces power consumption because the local refresh controllers 120 do not pass the clocking signal to the memory 130 unless the memory 130 is being accessed or refreshed, thus the memory 130 remains in a low power state for the remainder of the time.

Local refresh controllers 120 control refreshes through receipt of refresh opportunity commands from the master refresh controller 110 coupled to each local refresh controller 120. A refresh opportunity command is a signal indicating that a memory 130 can be refreshed because there is no impending or current access to that memory 130. The master refresh controller 110 coordinates when to perform refreshes through sending the refresh opportunity commands only to the local refresh controllers 120 of unused memories 130 on any given clock. In other words, the master refresh controller 110 provides the local refresh controllers 120 with refresh opportunity commands when their associated memory 130 is idle.

In one embodiment, the local refresh controllers 120 perform refreshes of their memories 130 at T/K time intervals when refresh opportunity commands are received. Additionally, the local refresh controllers 120 each have an internal clock that indicates when the memory 130 associated with the local refresh controller 120 needs to be refreshed. Local refresh controllers 120 will refresh the memory 130 when its internal clock indicates the refresh timeout period has been reached.

In one embodiment, the memories 130 are memory macros. A memory macro is a specific implementation of a memory from a process library. A blueprint of a memory macro is selected to be fabricated as part of the SOC 100. Typically, these blueprints or implementations result in a manufactured hard intellectual property (IP) memory component of a specific size. Each macro is a separate pre-configured device on the SOC 100 and requires its own address data and control. In embodiments, memories 130 comprises any suitable form of random access memory (RAM) now known or later developed, such as dynamic random access memory (DRAM), embedded DRAM (EDRAM), and the like. In other embodiments, other types of memory that require refresh are used. The microprocessor 105 can be any processor or microcontroller, such as that suitable for use in a SOC. In alternative embodiments, the SOC comprises a plurality of microprocessors or microcontrollers.

The SOC 100 can be implemented in a variety of systems. For example, the SOC 100 can be part of a stand alone microcomputer or used in embedded computing applications such as avionics and ground systems. In an embodiment where the SOC 100 is integrated into an avionics system, at least one of the I/O devices 150-1-4 is communicatively coupled to an avionics sensor. Avionics sensors are sensors used in an avionics system, including but not limited to, pressure sensors, air speed sensors, position sensors, force measurement sensors, and cockpit indicators.

Figure 2:
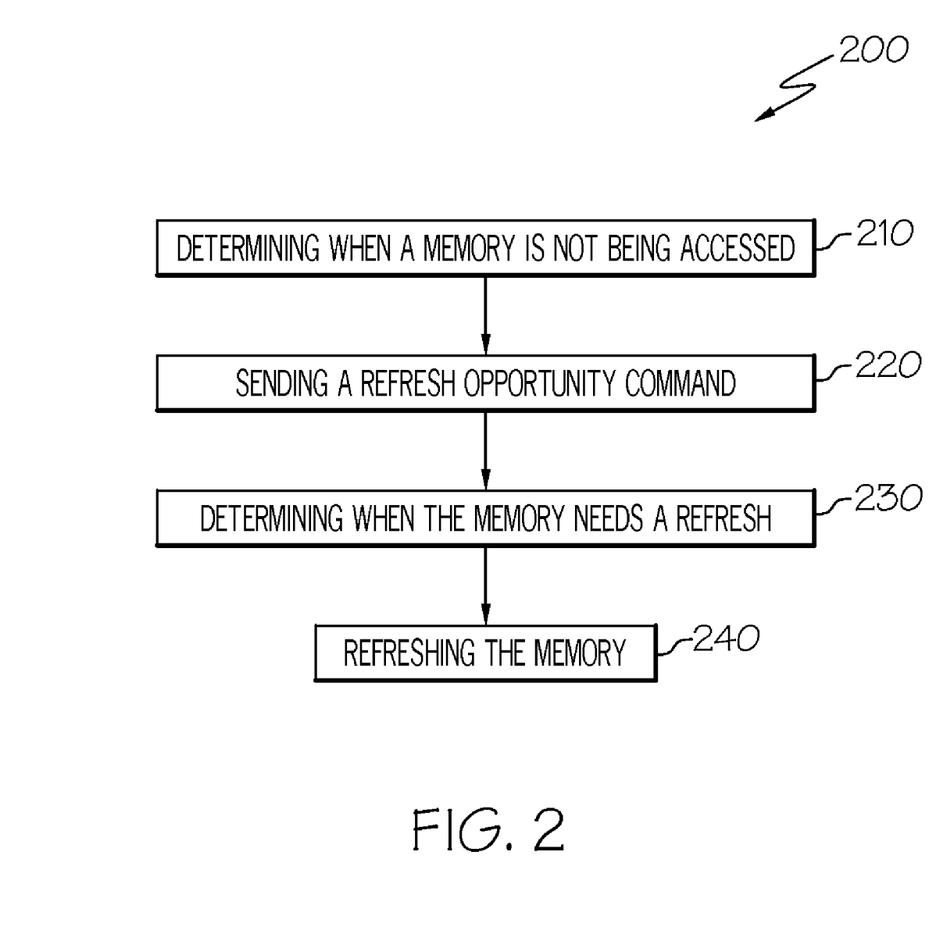
FIG. 2 is a flow diagram of one embodiment of a method of refreshing memory in a system on a chip (SOC).

FIG. 2 is a flow diagram of one embodiment of a method 200 of refreshing memory in a system on a chip (SOC). The method 200 comprises determining when a memory is not being accessed by a processor or another resource (block 210). The master refresh controller monitors each memory in the memory array to detect when each memory is not being accessed.

The master refresh controller sends refresh opportunity commands to the local refresh controller associated with any memory that is not currently accessed by a processor or another resource (block 220). In one embodiment, the master refresh controller does not send an refresh opportunity command for a memory with impending access. In one embodiment, the rate of sending out refresh opportunity commands depends on how often a particular memory is accessed. In another embodiment, the refresh opportunity commands are distributed in a staggered (or round robin) fashion so that only one memory at a time will be turned on for refresh.

Each local refresh controller will determine when its memory needs a refresh (block 230). A refresh opportunity command indicates an opportunity to refresh the memory; however the memory may not need to be refreshed at every opportunity. In one embodiment, the local refresh controller will initiate a refresh based on how much time has elapsed since its memory was last refreshed and based on the receipt of a refresh opportunity command. A refresh timeout signal occurs when the local refresh controller's internal clock indicates the memory needs to be refreshed. In one embodiment, the local refresh controller will only respond to a refresh opportunity command if its internal clock indicates that its memory needs a refresh. In another embodiment, the local refresh controller performs refreshes in advance. These advance refreshes are performed so that future accesses to the memory may be unimpeded. However it does so, once the local refresh controller determines that its memory needs to be refreshed, the local refresh controller initiates a refresh of the memory (block 240).

Figure 3A:
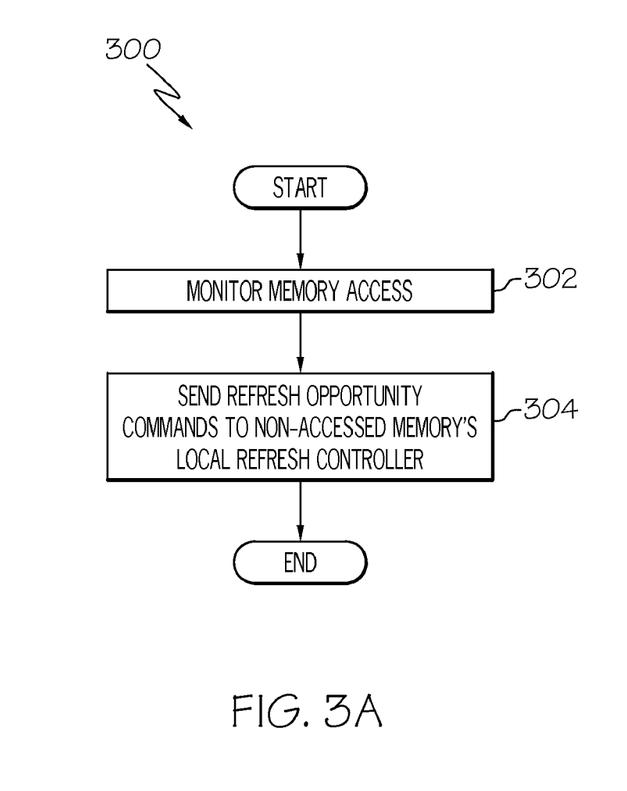
FIG. 3A is a flow diagram of one embodiment of a method of using a master refresh controller to refresh a plurality of memories.

A discussion of the separate methods of use of a master refresh controller and a local refresh controller is illustrative. FIG. 3A is a flow diagram of one embodiment of a method 300 of using a master refresh controller to refresh a plurality of memories. The method 300 begins with the master refresh controller monitoring each memory of the memory array to determine when the memory is being accessed (block 302). For each memory not being accessed, the master refresh controller sends a refresh opportunity command to that memory's local refresh controller (block 304).

Figure 3B:
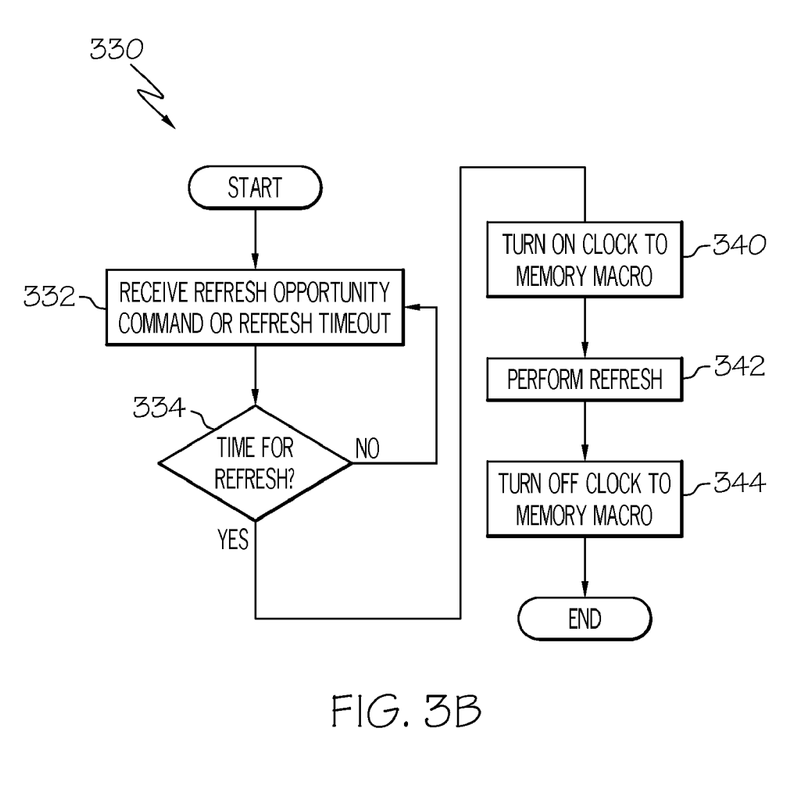
FIG. 3B is a flow diagram of one embodiment of a method of using a local refresh controller to refresh a memory.

FIG. 3B is a flow diagram of one embodiment of a method 330 of using a local refresh controller to refresh a memory. The local refresh controller receives a refresh opportunity command or a refresh timeout signal (block 332). If the local refresh controller receives a refresh opportunity command and it is not yet time for the memory to be refreshed (block 334), the memory is not refreshed.

If it is time for the memory to be refreshed (block 334), the local refresh controller turns on the clock to the memory (block 340). The refresh is performed (block 342). Once the refresh is complete, the clock to the memory is turned off (block 344). In this manner, power is managed by providing clocking only to those memory macros that are in use for either data access by the system or undergoing refresh. In another embodiment, the local refresh controller updates a memory bank that the memory has been refreshed.

Figure 4A:
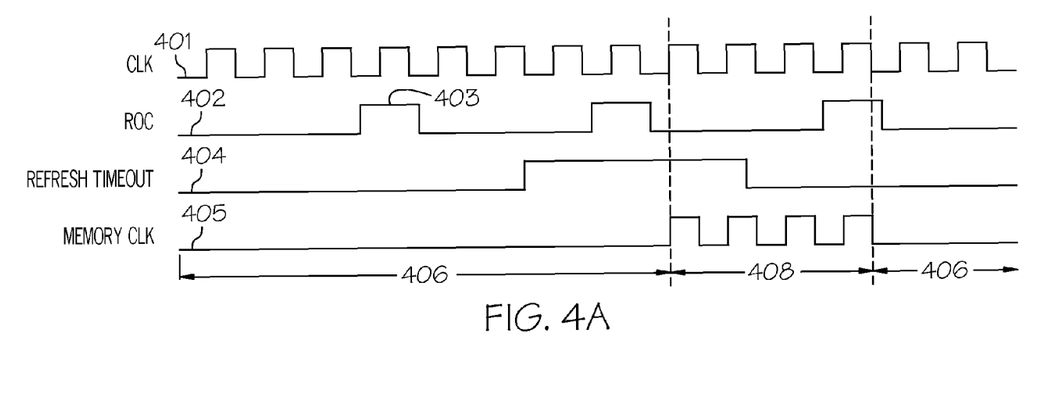
FIGS. 4A-4D are timing diagrams of exemplary scenarios of memory refresh employing distributed refresh control.

FIGS. 4A-4D are timing diagrams of exemplary scenarios of memory refresh employing distributed refresh control. FIG. 4A is a timing diagram for one embodiment of a refresh of an idle memory. A central clock source provides clock signal 401, which is gated by the local refresh controller that controls the memory. The master refresh controller outputs a refresh opportunity signal 402 to the local refresh controller. A peak 403 in the refresh opportunity signal 402 indicates that the memory can be refreshed without any processing loss. A refresh timeout signal 404 indicates when the memory must be refreshed.

In this example, the memory is not currently being accessed and is in a low power state during times 406. Upon receiving the refresh timeout and having a refresh opportunity command (ROC) 403, the local refresh controller allows the clock signal 401 to pass to the memory during time 408. At that point, the memory is in a high power state and undergoes a refresh. Once the refresh is completed, the memory returns to a low power state.

Figure 4B:
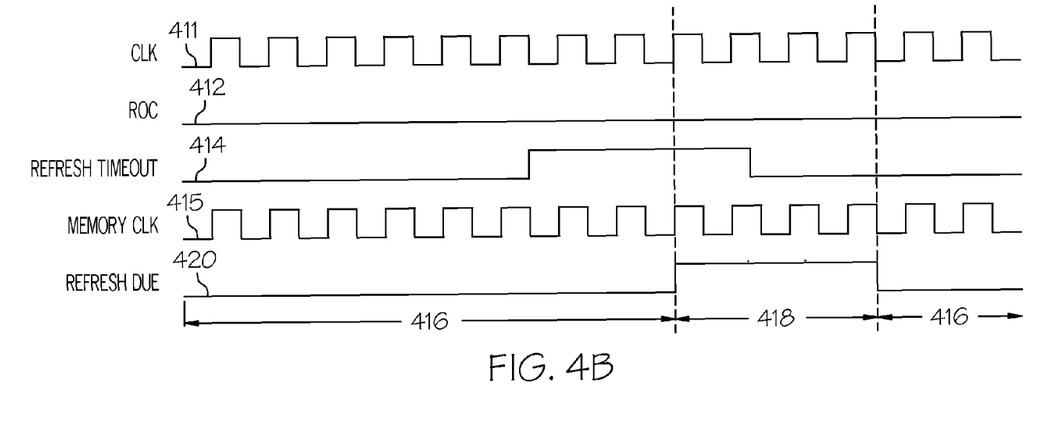

FIG. 4B is a timing diagram for one embodiment of a refresh of a memory under constant access activity. A clock signal 411 is passed to the memory during access so memory clock 415 is in the on, high power state. Since the memory is constantly accessed, a refresh opportunity signal 412 does not indicate that the memory can be refreshed because there is no opportunity to refresh without interrupting access to the memory. Eventually a refresh timeout signal 414 indicates the memory must be refreshed. A refresh due signal 420 is provided by the local refresh controller, interrupts the access to the memory, and begins the refresh at time 418. The refresh due signal 420 is based on the refresh timeout signal 414 plus a period of time such that under the worst case condition of constant memory access, the memory will undergo the number of refreshes required within the maximum refresh time. This ensures the refresh due signal 420 is the maximum of the number of refreshes required divided by the maximum refresh time. During times 416 and 418, the memory is in a high power state.

Figure 4C:
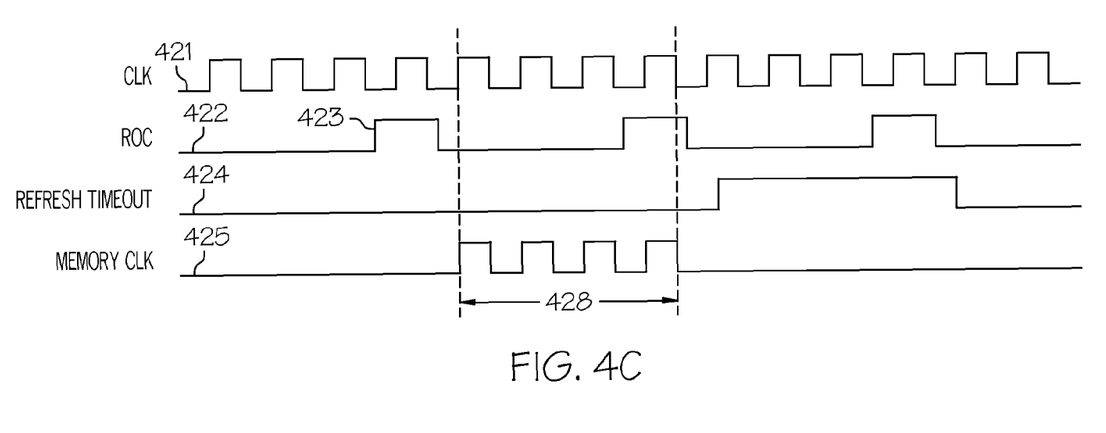

FIG. 4C is a timing diagram for one embodiment of a refresh of a memory being refreshed in advance. Before a refresh timeout signal 424 indicates the memory needs to be refreshed, the local refresh controller initiates a refresh after receiving an ROC 423 from a refresh opportunity signal 422. The local refresh controller passes a clock signal 421 to the memory during time 428 and the memory is refreshed.

Figure 4D:
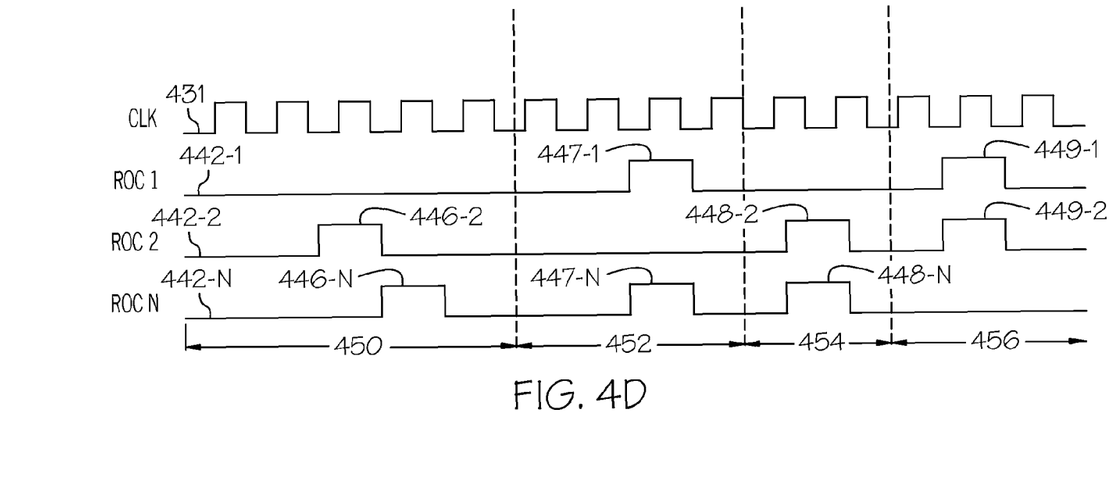

FIG. 4D is a timing diagram for a master refresh controller coupled to N local refresh controllers coupled individually to memories 1-N. The master refresh controller has N refresh opportunity command signals 442-1 through 442-N for each memory 1-N. A clock signal 431 is provided to the master refresh controller. During time 450, a processor is accessing memory 1. The refresh opportunity signal 442-1 does not provide an ROC to local refresh controller 1 during this time because memory 1 is being accessed. However, refresh opportunity signals 442-2 and 442-N do provide ROCs 446-2 and 446-N, respectively, because memory 2 and memory N are not accessed during time 450.

At time 452, the processor has ceased accessing memory 1 and begins accessing memory 2. Therefore, refresh opportunity signal 442-1 provides ROC 447-1, and signal 442-N provides ROC 447-N. At time 454, the processor begins to access memory 1 again, thus the master refresh controller sends ROCs 448-2 and 448-N. Finally, at time 456, the processor is only accessing memory N, so ROCs 449-1 and 449-2 are sent.

Figure 5:
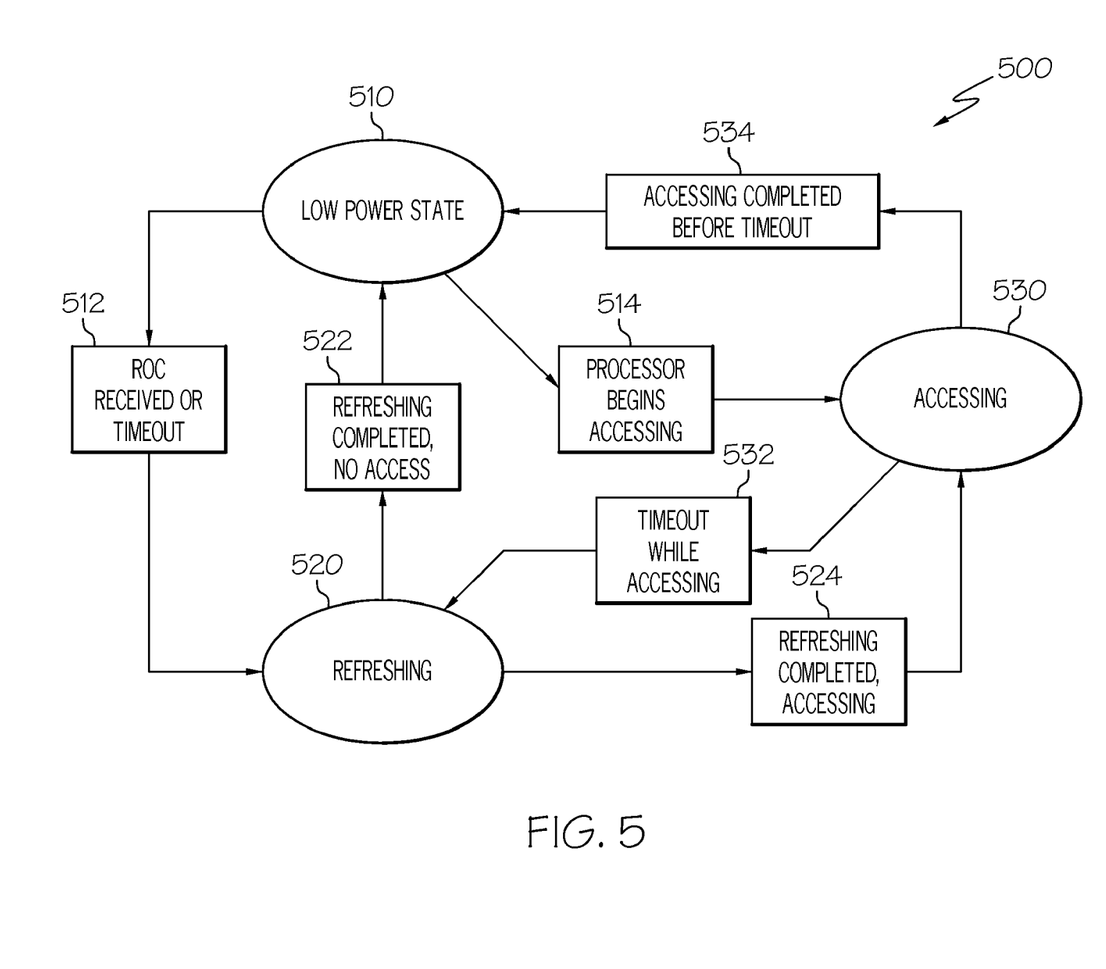
FIG. 5 is state diagram of one embodiment of the states of a memory.

FIG. 5 is state diagram 500 of one embodiment of the states of a memory. A memory is in a low power state 510 when the memory is not being accessed (state 530) or refreshed (state 520). If the local refresh controller acts on a refresh opportunity command or receives a refresh due timeout signal 512, the local refresh controller refreshes the memory. The memory's state is changed to the refreshing state 520. Once refreshing 520 is complete, the memory will return to the low power state 510 if the memory is not being accessed 522 or will change to the accessing state 530 if the memory is being accessed 524.

Once in the accessing state 530, if the processor is done accessing the memory before the refresh timeout period is up 534 the memory goes back to the low power state 510. If the memory is being accessed longer than the refresh timeout period 532, the memory will be forced into the refreshing state 520. In this rare case of continuous access to the same memory with no idle breaks, processor performance is affected.

Power is thus managed by only clocking the memory when that memory requires refresh or is actively being used by a processor (states 520 and 530). Having the local refresh controller and refresh address proximate to each memory and clocked only when needed by that memory further reduces power. Splitting up a refresh command by individual memory or a group of memories reduces the number of clock cycles for which each memory is on. Since each memory is on higher power for fewer cycles, power consumption is reduced.

For example, an SOC with 32 dual ported memory macros can at most be accessing two memory macros at once. The other 30 memory macros have their clocks turned off, and are in low-power state 510. A memory macro could be turned on to refresh while other memory macros that do not need refreshing remain in low power state 510. In this example, 3 out of 32 macros are on at once, which reduces peak and overall power. Therefore, each memory macro only has to be on $\frac{1}{32}$ of the time than it would have to be on with a global refresh controller.

Individual memories in a SOC have typically been treated as a single memory array. However, refreshing memories individually minimizes the impact of required periodic refreshes for dynamic memories on an SOC and maintains the high performance benefit that the memories offer by being on the SOC. Keeping the memories in the lowest quiescent power state possible through not unnecessarily refreshing the memories reduces both power consumption and peak power. However, more logic gates may be required to implement the local refresh controllers when splitting up refreshing the memories.

A number of embodiments of the invention defined by the following claims have been described. Nevertheless, it will be understood that various modifications to the described embodiments may be made without departing from the spirit and scope of the claimed invention. Aspects or features described with respect to one embodiment may be combined with or replace aspects or features described in alternative embodiments. Accordingly, other embodiments are within the scope of the following claims.

What is claimed is:

1. A method for refreshing memory, comprising:
   determining when a first memory of a plurality of memories is not being accessed;
   sending a refresh opportunity command from a master refresh controller to one of a plurality of local refresh controllers based on a determination that the first memory is not being accessed, wherein the one of a plurality of local refresh controllers controls only the first memory;
   determining when the first memory needs refreshing; and
   refreshing the first memory.

2. The method of claim 1, wherein refreshing the first memory further comprises:
   turning on a clock that provides timing to the first memory;
   performing the refresh; and
   turning off the clock.

3. The method of claim 1, wherein determining when the first memory needs refreshing further comprises:
   determining when a refresh timeout period has elapsed since the first memory was last refreshed.

4. The method of claim 3, wherein refreshing the first memory further comprises:
   refreshing the first memory when the refresh timeout period has elapsed and when the local refresh controller has received a refresh opportunity command.

5. The method of claim 1, wherein refreshing the first memory further comprises:
   refreshing the first memory when the duration of time since the first memory has previously been refreshed exceeds a refresh timeout period.

6. The method of claim 1, wherein refreshing the first memory further comprises:
   refreshing the first memory before a refresh timeout period is exceeded and when a refresh opportunity command has been sent.

7. The method of claim 1, further comprising:
updating a memory bank that the first memory has been refreshed.

8. The method of claim 1, further comprising:
receiving a refresh timeout signal at the one of a plurality of local refresh controllers when the first memory needs to be refreshed.

9. The method of claim 1, further comprising:
determining when a second memory is not being accessed;
sending a refresh opportunity command from the master refresh controller to a second local refresh controller when the second memory is not being accessed, wherein the second local refresh controller is associated with the second memory;
determining when the second memory needs refreshing; and
refreshing the second memory.

10. An distributed refresh control apparatus, comprising:
a plurality of local refresh controllers each responsible for refreshing one of a plurality of memories;
a master refresh controller that sends refresh opportunity commands to the plurality of local refresh controllers; and
wherein the mater refresh controller sends refresh opportunity commands to a first local refresh controller based on a determination that a first memory controlled by the first local refresh controller is not being accessed.

11. The apparatus of claim 10, further comprising:
a first clock coupled to the first local refresh controller, wherein the first clock indicates to the first local refresh controller when the first memory requires refreshing.

12. The apparatus of claim 10, further comprising:
wherein each of the plurality of local refresh controllers refreshes only a single memory of the plurality of memories.

13. The apparatus of claim 12, further comprising:
wherein the first local refresh controller performs a refresh of the first memory before a refresh timeout period elapses.

14. The apparatus of claim 10, wherein the plurality of memories comprise memory macros.

15. The apparatus of claim 10, further comprising:
a microprocessor, wherein the microprocessor is configured to access the plurality of memories; and
wherein the plurality of memories are only powered on when accessed by the microprocessor or when refreshing.

16. A system with refreshing, comprising:
a microprocessor;
at least one input/output device;
a plurality of memories, wherein the plurality of memories require periodic refreshing;
a master refresh controller, wherein the master refresh controller is configured to coordinate refreshing of the plurality of memories; and
a plurality of local refresh controllers, wherein:
each local refresh controller is communicatively coupled to one of the plurality of memories; and
each local refresh controller initiates a refresh of the one of the plurality of memories to which the local refresh controller is communicatively coupled;
wherein the master refresh controller distributes refresh opportunity commands to one of the plurality of local refresh controllers based on a determination that the memory the one of the plurality of local refresh controllers is communicatively coupled to is not being accessed by the microprocessor.

17. The system of claim 16, wherein the at least one input/output device is coupled to an avionics sensor.

18. The system of claim 16, wherein the system is integrated into a system on a chip (SOC).

19. The system of claim 16, wherein each local refresh controller initiates a refresh of the one of the plurality of memories further comprises:
wherein one of the plurality of local refresh controllers initiates a refresh based on receipt of a refresh opportunity command and a refresh timeout signal indicating the memory the one of the plurality of local refresh controllers is communicatively coupled to needs refreshing.

* * * * *